United States Patent
Pileggi et al.

(10) Patent No.: US 6,651,232 B1
(45) Date of Patent: Nov. 18, 2003

(54) METHOD AND SYSTEM FOR PROGRESSIVE CLOCK TREE OR MESH CONSTRUCTION CONCURRENTLY WITH PHYSICAL DESIGN

(75) Inventors: Lawrence Pileggi, Pittsburgh, PA (US); Christopher Dunn, Sunnyvale, CA (US); Satyamurthy Pullela, Cupertino, CA (US); Majid Sarrafzadeh, Wilmette, IL (US); Tong Gao, Mountain View, CA (US); Salil Raje, Santa Clara, CA (US)

(73) Assignee: Monterey Design Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/186,430

(22) Filed: Nov. 5, 1998

(51) Int. Cl.[7] .............................................. G06F 17/50
(52) U.S. Cl. ................................ 716/7; 716/10; 716/12
(58) Field of Search ............................... 716/1, 2, 6, 7, 716/8, 10, 11, 12, 13, 18

(56) References Cited

U.S. PATENT DOCUMENTS

| | | | |
|---|---|---|---|
| 5,638,291 A | 6/1997 | Li et al. | |
| 5,717,229 A | 2/1998 | Zhu | |
| 5,774,371 A | 6/1998 | Kawakami | |
| 5,963,728 A | * 10/1999 | Hathaway et al. ............. | 716/3 |

OTHER PUBLICATIONS

Boese et al., "Zero–Skew Clock Routing Trees with Minimum Wirelength," IEEE, pp 17–21, 1992.*

Chao et al., "Zero–Skew Clock Routing with Minimum Wirelength," IEEE Transactions on Circuits and Systems, vol. 39, No. 11, pp 799–814, 1992.*

Cong et al., "Minimum–Cost Bounded–Skew Clock Routing," IEEE, pp 215–218, 1995.*

Takahashi etal., "Clock–Tree Routing Realizing a Clock–Schedule for Semi–Synchronous Circuits," IEEE, pp 260–265, 1997.*

Pullela, S., "Post Processing of clock Trees via Wiresizing and Buffering for Robust Design", IEEE Trans. on Comp. Aid Design of Int. Circuits and Syst. vol. 15, No. 6, pp. 691–701. Jun. 6, 1996.

Edahiro, M., "Delay Minimization for Zero–Skew Routing," IEEE International Conference on Computer Aided Design, pp. 563–566, 1993.

* cited by examiner

*Primary Examiner*—Leigh M. Garbowski
(74) *Attorney, Agent, or Firm*—Vierra Magen Marcus Harmon & DeNiro LLP

(57) ABSTRACT

Progressively optimized clock tree/mesh construction is performed concurrently with placement of all remaining objects. Clock tree/mesh is specified loosely for initial placement, then followed by progressive detailed placement. In particular, preferred approach provides automated and reliable solution to clock tree/mesh construction, occuring concurrently with placement process so that clock tree wiring and buffering considers and influences placement and wiring of all other objects, such as logic gates, memory elements, macrocells, etc. Hence, in this concurrent manner, clock tree/mesh pre-wiring and pre-buffering may be based on construction of approximate clock tree using partitioning information only, i.e., prior to object placement. Further, present approach provides modified DME-based clock tree topology construction without meandering, and recursive algorithm for buffered clock tree construction.

66 Claims, 2 Drawing Sheets

| Given initial region or bin sizes and latch counts in them, subdivide each bin down to size pre-determined that balanced routing in minimum area is unnecessary | ~20

⇓

| Distribute latches among minimum size bins randomly, uniformily, or other way | ~22

⇓

| Approximate routing in bin assuming signal routing used at level | ~24

⇓

| Perform pair-wise bottom-up topology selection from minimum-size bins up to root of tree using DME balanced routing to determine routing portion of clusters | ~26

⇓

| Based on DME tree, as post-process, determine number of buffer levels, then buffer and size tree segments | ~28

⇓

| Preserve lowest level of buffered tree, including inserted buffers, and discard all other portions of DME tree | ~30

⇓

| Keeping lowest level of tree, return to perform routing and topology selection from this buffer layer to root. Repeat steps recursively until buffered tree constructed | ~32

FIG. 3

METHOD AND SYSTEM FOR PROGRESSIVE CLOCK TREE OR MESH CONSTRUCTION CONCURRENTLY WITH PHYSICAL DESIGN

FIELD OF INVENTION

Invention relates to computer-aided engineering (CAE) tools for system and circuit design, particularly to automation software for providing clock tree/mesh construction concurrently with physical design.

BACKGROUND OF INVENTION

Commercially-available electronic design automation (EDA) software tools provide electronics and system design engineers with conventional means to define and verify functional and physical aspects of circuit and system design. In particular, design functional definition may be represented in so-called netlist or equivalent file, typically including various components and electrical interconnections therein. Moreover, ordinarily, certain designs may include one or more interconnections associated with relatively time-critical signals or datapaths, such as clocking or other synchronized timing signals.

However, physical implementation of designs embodying such critical timing paths may be subject to undesirable signal delay or skewing, for example, arising from interconnect parasitic resistance or capacitance, or other manufacturing implementation related factors. Accordingly, to mitigate or eliminate such undesirable signal effects, known techniques have been detailed to insert buffers, latches or repeaters, or otherwise introduce effectively temporally counter-acting circuit or interconnect elements or modifications in such critical timing paths, particularly directed at so-called clock trees or meshes.

Such known techniques generally contemplate element insertion or re-sizing in serial fashion, i.e., before or after placement of circuit components, such as logic gates and cells. Pre-placement approach is not practical because introduced components, such as buffers, latches, or repeaters, may move during placement. Furthermore, clock tree construction before determining topology, length, and buffering of subject tree may result in overdesigned or improperly designed circuit. Additionally, post-placement approach to clock tree construction is not practical because routing resources are not properly preserved.

For example, by using placement tools available commercially from Cadence Design Systems (San Jose, Calif.), such as Qplace product for initially placing logic gates, and then CTgen product for synthesizing clock tree, final pass of detailed placement is performed subsequently to address apparent design errors, but such conventional methodology offers no means to iterate design back to global optimization placement algorithms.

SUMMARY OF INVENTION

Invention resides in electronic design system and/or methodology wherein clock tree or mesh construction is optimizable progressively, preferably concurrently with object placement. Generally, clock tree is specified loosely for initial placement, then followed by progressive detailed placement.

In particular, preferred approach provides automated and reliable solution to clock tree/mesh construction, occuring concurrently with placement process so that clock tree wiring and buffering considers and influences placement and wiring of all other objects, such as logic gates, memory elements, macrocells, etc. Hence, in this concurrent manner, clock tree/mesh pre-wiring and pre-buffering may be based on construction of approximate clock tree using partitioning information only, i.e., prior to object placement. Further, present approach provides modified DME-based clock tree topology construction without meandering, and recursive algorithm for buffered clock tree construction.

BRIEF DESCRIPTION OF DRAWINGS

FIG. 3 is flow chart of operational steps of present invention aspect.

DETAILED DESCRIPTION OF PREFERRED EMBODIMENT

Embodiment is implemented in computer-aided or other functionally programmable design automation system and/or software for progessive optimization of clock mesh or tree constuction. Initially, objects are placed initially according to circuit design specification, wherein clock tree/mesh is generated generally concurrently therewith. Then, progessively more detailed object placement is accomplished in consideration of generated clock tree/mesh.

Preferably, detailed placement is accomplished per wiring or buffering provided in clock tree/mesh, and pre-wiring or pre-buffering also provided therein is subject to partitioning thereof. Additionally, clock tree/mesh topology is substantially non-meandering, and generated by recursive procedure to achieve progessively optimized topology construction.

Figure 1:
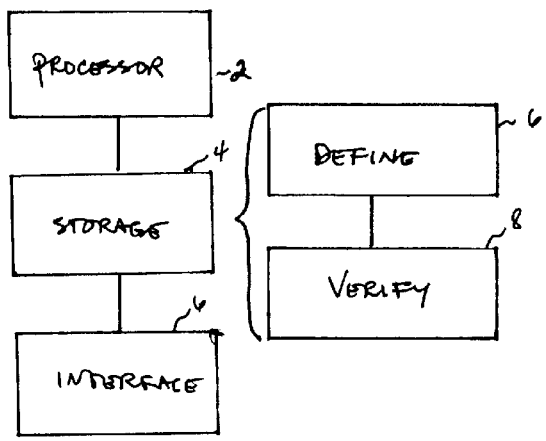
FIG. 1 is general block diagram of electronic design automation system for implementing present invention.

FIG. 1 diagram shows electronic design automation (EDA) system, including. conventional computing workstation or microprocessor 2, digital memory or storage 4, and peripheral or network interface 6, as well computer-aided software, firmware and/or hardware tools for defining 6 and/or verifying 8 prototype, system or circuit design according to present invention. Such EDA system may be implemented in distributed fashion in one or more networked processors or computers.

During operation, netlist file is specified or generated initially, for example, through schematic capture or logic synthesis, by definition tool 6, to include one or more interconnected components or objects, such as transistors, logic gates, memory elements, macrocells, etc. Such prototype module, board, chip, circuit or system design definition may be partitioned or otherwise sub-defined at various level, cluster, or grouping representing certain functional, logical or arbitrary abstractions thereof. For instance, object partitioning may be achieved in top-down hierarchical manner or through physical lay-out or floorplanning of semiconductor integrated circuit design.

Figure 2:
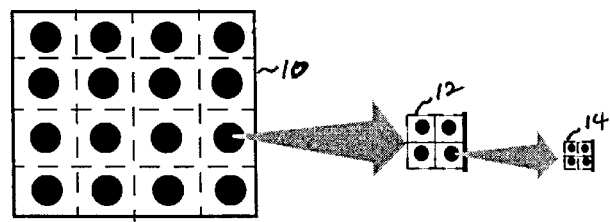
FIG. 2 is simplified placement diagram according to present invention.

FIG. 2 diagram illustrates design partitioning effectively of netlist into equal size physical regions or bins 10, 12, 14, whereby subject chip circuit area is actually partitioned, such that netlist file design information may be mapped thereupon. Generally, floorplanning provides neighboring rectangular regions which may be sized unequally. Synchronizable device, such as latch or flip-flop, counts within each bin are calculated after partitioning. Further, to estimate routing and buffering within region, each region is subdivided recursively, i.e., until latch and flip-flop placements therein are localized to predetermined region size. Preferably, below such size threshold, generalized signal routing estimation may be used, without buffering.

Upon initial floorplanning or partitioning, latch sites are distributed among partitioned regions, such that latch and/or flip-flop (FF) counts are associated with each bin. Preferably, latch count per region remains relatively constant during subsequent design stages. Initial design of top-layer clock tree or mesh is performed at present stage. Such initial physical design may be used exclusively to reserve routing and buffering resources, as well as to indicate any areas used during placement optimization.

Routing and construction of clock tree or mesh top layer depends on, or is defined, at least in part, according to, not only latch capacitance, but also associated routing, as well as any intermediate buffers and inverters in subject clock tree or mesh. Hence, with clock tree or mesh top layer designed with downstream loading in mind, complete or approximate clock tree or mesh is constructed to estimate downstream metal or routing interconnect and buffering.

Further, original regions may be partitioned to predetermined minimum size, below which balanced routing or buffering are not required, and signal routing estimation is used. Latch placements may be approximated in each region or bin for uniform distribution thereof within minimum size bins. Random or other stochastic model is used for approximating latch or equivalent object placement within each region.

When region latches are distributed to minimum size bin resolution, balanced tree routing is performed from such minimum bins to clock tree or mesh top level. Below minimum bin discretization size, simple minimum length routing is applied, such that balanced routing is unnecessary. Wiring in minimum size bins is approximated per signal wiring estimates. Above bin discretization level, balanced routing establishes wiring estimation.

Buffered clock tree or mesh is constructed approximately, for example, using greedy procedure and/or modified version of so-called Deferred Merge Embedding (DME) approach for balanced routing. In particular, corresponding signal interconnect capacitances may be paired and routed in bottom-up manner, whereby delays to latch sites are equalized accordingly. Hence, merging points between segments are selected to balance delays to latch sites, e.g., according to so-called Elmore delay algorithm.

DME is modified to produce balanced delays for routes on two orthogonal metal layers. The horizontal layer is selected as the single routing layer in a transformed coordinate system, in which distances in the vertical direction are expanded or contracted by some amount in order that delay estimates in the vertical direction on the horizontal metal layer in the transformed coordinate system are approximately equal to delay estimates in the vertical direction on the vertical metal layer in the true coordinate system. Then the placement of the tree may be altered in another bottom-up pass with more exact delay estimates for the proper metal layers.

Preferably, present modified DME approach offers non-meandering solution in case of no feasible merge segment. In such case, present approach effectively sub-optimalizes or lengthens certain merge segments in reverse path of subject clock tree or mesh. Path-length penalty is relatively small, and such added path-length provides. balanced merge. At present stage, clock tree or mesh is deemed approximate, and nodes are mobile. Additionally, meandering may be avoided by determining tapping point by providing left and right paths with different widths or additional dummy loads.

Once DME-balanced route for approximate clock tree or mesh is constructed, buffers are inserted therein, and wires are sized, in addition to sizing during DME routing and topology selection, to meet electrical and reliability requirements. Preferably, approximate latch sites are treated as exact locations.

Regarding post-routing clock tree or mesh optimization, clock buffers and inverters, which are approximately sized and inserted uniformity across levels of clock tree or mesh, are considered in area estimates for placement. As understood herein, latches may encompass flip flops, buffers may encompass inverters, and vice versa. Approximate wiring may represent wiring blockages, i.e., similarly to pre-wire design usage.

Preferably, modified clock tree or mesh DME construction is accomplished without knowledge of buffering and wire sizing. Further, clock tree or mesh topology is suboptimal, and DME pairings about initial buffering level may be changed. Hence, buffered clock tree construction is recursive, such clock tree or mesh being constructed from first level of buffering up to main driver (i.e., root level) of clock tree or mesh. In this progressively optimizable manner, clock tree or mesh is buffered and sized, and rebuilt recursively from second level of buffering up to root, and so on.

FIG. 3 flow chart summarizes bottom-up approximate clock tree or mesh construction. Initially, region or bin sizes and latch counts are specified 20, thereby each bin being subdivided down to size, and pre-determined that balanced routing within such minimum area will not be necessary.

Then, latches are distributed 22 among minimum size bins either randomly, uniformity, or by some other similar stochastic means. And approximate routing within bin assuming signal routing will be used 24 at this level. Pair-wise, bottom-up topology selection is performed 26 from minimum-size bins up to root of tree using DME or other form of balanced routing to determine routing portion of clusters.

Based on such modified DME tree, number of buffer levels, then buffer and size tree segments, are determined for post-processing thereof 28. Lowest level of buffered tree, including inserted buffers, are preserved 30, thereby discarding all other portions of modified DME clock tree or mesh. Note that original DME tree is constructed assuming no buffers, possibly leading to inaccurate topology selection, except for lowest portion of tree, which has no buffers.

Finally, lowest level of tree is maintained 32, and then return to step 26 to perform routing and topology selection from buffer layer to root. Accordingly, steps 26, 28, 30 may be repeated recursively until buffered tree is constructed. On completed construction of approximate clock tree or mesh, topology of top level of clock tree or mesh, which connects to regions shown, is selected and sized preferably using wire and buffer estimates in each bin or region. Blockages may be considered during such recursive process. It is further contemplated that present recursive process applies generally as well to buffered clock tree construction at any level of physical design as specified herein, as well as to any approximate clock tree or other equivalent synchronous signal interconnect construction.

Clock tree or mesh top level, including any buffering, may be instantiated as pre-wiring and pre-placed objects for subsequent physical design stage. Optionally, pre-wires and pre-placed objects are adjusted or modified in subsequent placement. Pre-wirings and pre-placed objects serve to reserve resources for eventual clock tree or mesh construction.

Alternatively, pre-wiring and pre-placed objects are treated as fixed blockages, and remainder of clock tree or mesh is extended from such fixed portions. Additionally top level clock tree or mesh construction, downstream loading, e.g., wiring and buffering, are approximated as determined from top of each bin or region. Such information may be used to estimate wire congestion and gate area consumed by clock tree within each region or bin.

Present clock tree or mesh construction process applies to iterative improvement placement, including so-called quadratic methodology using partitioning-style improvements of quadratic placement results.

Hence, in preferred embodiment, netlist is partitioned initially into quadrisection bins. Top level of clock tree or mesh is constructed as detailed herein. Placement is implemented by quadrisectioning portions, and clock tree or mesh estimates and pre-wiring/pre-placements are used during placement optimization process. In particular, clock tree or mesh routing may be indicated during global congestion map used for congestion optimization during physical design.

Such quadrisectioning may proceed by dividing each bin into four bins, and repeating placement optimization until bins have reached predetermined minimum size. With each level of quadrisection, latch positions become more precise, and process is progressively iterated for next level of bins, and downward accordingly. Prior clock tree or mesh construction level may remain fixed, or adjusted relatively slightly per iterated design detail. Generally, approximate tree is used as guide of level number of buffering, buffer sizes, as well as initial wire and buffer locations.

Preferred embodiment if top-down clock tree or mesh construction includes: construction, sizing, and routing of modified DME clock tree or mesh from root to top-most level of buffering, whereby buffers and wires may be instantiated effectively as pre-route entities. Then, any remaining clock tree or mesh components are accounted or recognized as part of intra-bin congestion for quadrisectioning-based placement. Furthermore, according to recognized levels of expected buffers, buffered clock tree or mesh may be constructed progressively as quadrisectioning continues, particularly since modified DME clock tree or mesh to level may be translated effectively to corresponding quadrisection level.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A method for constructing a clock tree in an integrated circuit design, said method comprising the steps of:
   (a) distributing latches among a first set of bins, wherein said first set of bins corresponds to a first level of said integrated circuit design;
   (b) performing topology selection between said first set of bins and a root for a first clock tree;
   (c) discarding at least a portion of said first clock tree outside of said first level; and
   (d) performing topology selection between a second set of bins and a root for a second clock tree, wherein:
      said second set of bins corresponds to a second level of said integrated circuit design,
      said step (d) is based at least in part on said first clock tree, and
      said clock tree includes a portion of said first clock tree from said first set of bins and a portion of said second clock tree from said second set of bins.

2. A method according to claim 1, wherein said method further includes the step of:
   (e) approximating routing within each bin in said first set of bins.

3. A method according to claim 2, wherein said step (e) is performed prior to performing said step (b).

4. A method according to claim 1, wherein said topology selection is a bottom-up topology selection from said first set of bins up to said root for said first clock tree.

5. A method according to claim 1, wherein said method includes the step of:
   (f) buffering at least one segment of said first clock tree.

6. A method according o claim 5, wherein said step (f) is performed after performing said step (b) and before performing said step (c).

7. A method according to claim 5, wherein said step (f) results in insertion of at least one buffer in said first clock tree, wherein said at least one buffer is included in said clock tree.

8. A method according to claim 5, wherein said method further includes the step of:
   (g) sizing at least one segment of said first clock tree, wherein said step (g) is performed after performing said step (b) and before performing said step (c).

9. A method according to claim 8, wherein said step (g) results in sizing of at least one segment in said first clock tree, wherein said at least one segment in said first clock tree is included in said clock tree.

10. A method according to claim 1, wherein said method includes the steps of:
    (h) buffering at least one segment of said second clock tree;
    (j) discarding portions of said second clock tree above said second set of bins; and
    (k) constructing clock tree segments for bins in each level of said integrated circuit design above said second level, wherein said step (k) is based at least in part on said second clock tree.

11. A method according to claim 10, wherein said clock tree includes a clock tree segment for each level in said integrated circuit design.

12. A method according to claim 10, wherein each bin in said second set of bins includes at least one bin from said first set of bins.

13. A method according to claim 1, wherein each bin in said first set of bins is a quadrisection.

14. A method according to claim 1, wherein each bin in said first set of bins is a minimum size quadrisection.

15. A method according to claim 14 wherein said minimum size quadrisection is a quadrisection in which balanced routing is unnecessary.

16. A method according to claim 1, wherein said step (b) is performed without meandering.

17. A method according to claim 1, wherein said step (b) results in balancing delays to said latches distributed among said first set of bins.

18. A method according to claim 1, wherein said step (c) discards at least a portion of said first clock tree from said second set of bins.

19. A method according to claim 1, wherein said at least a portion of said first clock tree outside of said first level is all of said first clock tree outside of said first level.

20. A method according to claim 1, wherein said at least a portion of said first clock tree outside of said first level is all of said first clock tree above said first level.

21. A method for clock tree generation in an integrated circuit design, said method comprising the steps of:
(a) distributing latches among a first set of bins, wherein said first set of bins corresponds to a first level of said integrated circuit design;
(b) performing topology selection between said first set of bins and a root for a first clock tree;
(c) discarding all of said first clock tree outside of said first level; and
(d) constructing clock tree segments for bins in each level of said integrated circuit design outside of said first level, wherein a clock tree for said integrated circuit design includes a clock tree segment associated with each level in said integrated circuit design, including a segment of said first clock tree from said first set of bins.

22. A method according to claim 21, wherein said method further includes the step of:
(e) approximating routing within each bin in said first set of bins prior to performing said step (b).

23. A method according to claim 22, wherein said method includes the step of:
(f) buffering at least one segment of said first clock tree, wherein said step (f) is performed after performing said step (b) and before performing said step (c).

24. A method according to claim 23, wherein said step (f) results in insertion of at least one buffer in said first clock tree, wherein said at least one buffer is included in said clock tree.

25. A method according to claim 23, wherein said method further includes the step of:
(g) sizing at least one segment of said first clock tree, wherein said step (g) is performed after performing said step (b) and before performing said step (c).

26. A method according to claim 25, wherein said step (g) results in sizing of said segment of said first clock tree.

27. A method according to claim 21, wherein said step (d) includes the steps of:
(1) performing a topology selection from a second set of bins up to a root for a second clock tree, wherein said second set of bins corresponds to a second level of said integrated circuit design and said second level is above said first level;
(2) buffering at least one segment of said second clock tree;
(3) discarding portions of said second clock tree above said second set of bins; and
(4) constructing clock tree segments for bins in levels of said integrated circuit above said second level, wherein said step (d)(4) is based at least in part on said second clock tree.

28. A method according to claim 27, wherein each bin in said second set of bins includes at least one bin from said first set of bins.

29. A method according to claim 21, wherein said step of constructing clock tree segments is based at least in part on said first clock tree.

30. A method according to claim 21, wherein said topology selection is a bottom-up topology selection from said first set of bins up to said root for said first clock tree.

31. One or more computer readable storage devices having computer readable code embodied on said one or more computer readable storage devices, said computer readable code for programming one or more computers to perform a method for constructing a clock tree in an integrated circuit design, said method comprising the steps of:
(a) distributing latches among a first set of bins, wherein said first set of bins corresponds to a first level of said integrated circuit design;
(b) performing topology selection between said first set of bins and a root for a first clock tree;
(c) discarding at least a portion of said first clock tree outside of said first level; and
(d) performing topology selection between a second set of bins and a root for a second clock tree, wherein:
said second set of bins corresponds to a second level of said integrated circuit design,
said step (d) is based at least in part on said first clock tree, and
said clock tree includes a portion of said first clock tree from said first set of bins and a portion of said second clock tree from said second set of bins.

32. One or more computer readable storage devices according to claim 31, wherein said method further includes the step of:
(e) approximating routing within each bin in said first set of bins, wherein said step (e) is performed prior to performing said step (b).

33. One or more computer readable storage devices according to claim 31, wherein said topology selection is a bottom-up topology selection from said first set of bins up to said root for said first clock tree.

34. One or more computer readable storage devices according to claim 31, wherein said method includes the step of:
(f) buffering at least one segment of said first clock tree, wherein said step (f) is performed after performing said step (b) and before performing said step (c).

35. One or more computer readable storage devices according to claim 34, wherein said step (f) results in insertion of at least one buffer in said first clock tree, wherein said at least one buffer is included in said clock tree.

36. One or more computer readable storage devices according to claim 34, wherein said method further includes the step of:
(g) sizing at least one segment of said first clock tree, wherein said step (g) is performed after performing said step (b) and before performing said step (c).

37. One or more computer readable storage devices according to claim 36, wherein said step (g) results in sizing of at least one segment in said first clock tree, wherein said at least one segment in said first clock tree is included in said clock tree.

38. One or more computer readable storage devices according to claim 31, wherein said method includes the steps of:
(h) buffering at least one segment of said second clock tree;
(j) discarding portions of said second clock tree above said second set of bins; and
(k) constructing clock tree segments for bins in each level of said integrated circuit design above said second level, wherein said step (k) is based at least in part on said second clock tree.

39. One or more computer readable storage devices according to claim 38, wherein said clock tree includes a clock tree segment for each level in said integrated circuit design.

40. One or more computer readable storage devices according to claim 38, wherein each bin in said second set of bins includes at least one bin from said first set of bins.

41. One or more computer readable storage devices according to claim 31, wherein said step (c) discards at least a portion of said first clock tree from said second set of bins.

42. One or more computer readable storage devices according to claim 31, wherein said at least a portion of said first clock tree outside of said first level is all of said first clock tree above said first level.

43. One or more computer readable storage devices having computer readable code embodied on said one or more computer readable storage devices, said computer readable code for programming one or more computers to perform a method comprising the steps of:
(a) distributing latches among a first set of bins, wherein said first set of bins corresponds to a first level of said integrated circuit design;
(b) performing topology selection between said first set of bins and a root for a first clock tree;
(c) discarding all of said first clock tree outside of said first level; and
(d) constructing clock tree segments for bins in each level of said integrated circuit design outside of said first level, wherein a clock tree for said integrated circuit design includes a clock tree segment associated with each level in said integrated circuit design, including a segment of said first clock tree from said first set of bins.

44. One or more computer readable storage devices according to claim 43, wherein said method further includes the step of:
(e) approximating routing within each bin in said first set of bins prior to performing said step (b).

45. One or more computer readable storage devices according to claim 44, wherein said method includes the step of:
(f) buffering at least one segment of said first clock tree, wherein said step (f) is performed after performing said step (b) and before performing said step (c).

46. One or more computer readable storage devices according to claim 45, wherein said step (f) results in insertion of at least one buffer in said first clock tree, wherein said at least one buffer is included in said clock tree.

47. One or more computer readable storage devices according to claim 45, wherein said method further includes the step of:
(g) sizing at least one segment of said first clock tree, wherein said step (g) is performed after performing said step (b) and before performing said step (c).

48. One or more computer readable storage devices according to claim 43, wherein said step (d) includes the steps of:
(1) performing a topology selection from a second set of bins up to a root for a second clock tree, wherein said second set of bins corresponds to a second level of said integrated circuit design and said second level is above said first level;
(2) buffering at least one segment of said second clock tree;
(3) discarding portions of said second clock tree above said second set of bins; and
(4) constructing clock tree segments for bins in levels of said integrated circuit above said second level, wherein said step (d)(4) is based at least in part on said second clock tree.

49. One or more computer readable storage devices according to claim 48, wherein each bin in said second set of bins includes at least one bin from said first set of bins.

50. One or more computer readable storage devices according to claim 43, wherein said step of constructing clock tree segments is based at least in part on said first clock tree.

51. An apparatus, comprising:
one or more storage devices; and
one or more processors in communication with said one or more storage devices, said one or more processors perform a method for constructing a clock tree in an integrated circuit design, said method comprising the steps of:
(a) distributing latches among a first set of bins, wherein said first set of bins corresponds to a first level of said integrated circuit design;
(b) performing topology selection between said first set of bins and a root for a first clock tree;
(c) discarding at least a portion of said first clock tree outside of said first level; and
(d) performing topology selection between a second set of bins and a root for a second clock tree, wherein:
said second set of bins corresponds to a second level of said integrated circuit design,
said step (d) is based at least in part on said first clock tree, and
said clock tree includes a portion of said first clock tree from said first set of bins and a portion of said second clock tree from said second set of bins.

52. An apparatus according to claim 51, wherein said method further includes the step of:
(e) approximating routing within each bin in said first set of bins, wherein said step (e) is performed prior to performing said step (b).

53. An apparatus according to claim 51, wherein said method includes the step of:
(f) buffering at least one segment of said first clock tree, wherein said step (f) is performed after performing said step (b) and before performing said step (c).

54. An apparatus according to claim 53, wherein said method further includes the step of:
(g) sizing at least one segment of said first clock tree, wherein said step (g) is performed after performing said step (b) and before performing said step (c).

55. An apparatus according to claim 51, wherein said method includes the steps of:
(h) buffering at least one segment of said second clock tree;
(j) discarding portions of said second clock tree above said second set of bins; and
(k) constructing clock tree segments for bins in each level of said integrated circuit design above said second level, wherein said step (k) is based at least in part on said second clock tree.

56. An apparatus according to claim 55, wherein said clock tree includes a clock tree segment for each level in said integrated circuit design.

57. An apparatus according to claim 55, wherein each bin in said second set of bins includes at least one bin from said first set of bins.

58. An apparatus according to claim 51, wherein said step (c) discards at least a portion of said first clock tree from said second set of bins.

59. An apparatus according to claim 51, wherein said at least a portion of said first clock tree outside of said first level is all of said first clock tree above said first level.

60. An apparatus, comprising:

one or more storage devices; and one or more processors in communication with said one or more storage devices, said one or more processors perform a method comprising the steps of:
 (a) distributing latches among a first set of bins, wherein said first set of bins corresponds to a first level of said integrated circuit design;
 (b) performing topology selection between said first set of bins and a root for a first clock tree;
 (c) discarding all of said first clock tree outside of said first level; and
 (d) constructing clock tree segments for bins in each level of said integrated circuit design outside of said first level, wherein a clock tree for said integrated circuit design includes a clock tree segment associated with each level in said integrated circuit design, including a segment of said first clock tree from said first set of bins.

61. An apparatus according to claim 60, wherein said method further includes the step of:
 (e) approximating routing within each bin in said first set of bins prior to performing said step (b).

62. An apparatus according to claim 61, wherein said method includes the step of:
 (f) buffering at least one segment of said first clock tree, wherein said step (f) is performed after performing said step (b) and before performing said step (c).

63. An apparatus according to claim 62, wherein said method further includes the step of:
 (g) sizing at least one segment of said first clock tree, wherein said step (g) is performed after performing said step (b) and before performing said step (c).

64. An apparatus according to claim 60, wherein said step (d) includes the steps of:
 (1) performing a topology selection from a second set of bins up to a root for a second clock tree, wherein said second set of bins corresponds to a second level of said integrated circuit design and said second level is above said first level;
 (2) buffering at least one segment of said second clock tree;
 (3) discarding portions of said second clock tree above said second set of bins; and
 (4) constructing clock tree segments for bins in levels of said integrated circuit above said second level, wherein said step (d)(4) is based at least in part on said second clock tree.

65. An apparatus according to claim 64, wherein each bin in said second set of bins includes at least one bin from said first set of bins.

66. An apparatus according to claim 64, wherein said step of constructing clock tree segments is based at least in part on said first clock tree.

* * * * *